United States Patent
Kusumi (10) Patent No.: US 7,897,457 B2
(45) Date of Patent: Mar. 1, 2011

(54) METHOD FOR MANUFACTURING A NONVOLATILE SEMICONDUCTOR MEMORY DEVICE

(75) Inventor: Masataka Kusumi, Niigata (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/727,711

(22) Filed: Mar. 19, 2010

(65) Prior Publication Data

US 2010/0291745 A1 Nov. 18, 2010

(30) Foreign Application Priority Data

May 13, 2009 (JP) ................... 2009-116826

(51) Int. Cl.
*H01L 21/336* (2006.01)
(52) U.S. Cl. ... 438/258; 438/287; 438/262; 257/E21.423
(58) Field of Classification Search ................. 438/287, 438/241, 258, 261, 266; 257/E21.423
See application file for complete search history.

(56) References Cited

U.S. PATENT DOCUMENTS

| | | | | |
|---|---|---|---|---|
| 5,960,283 | A * | 9/1999 | Sato | 438/257 |
| 6,130,140 | A * | 10/2000 | Gonzalez | 438/430 |
| 6,297,096 | B1 | 10/2001 | Boaz | |
| 6,677,203 | B2 * | 1/2004 | Kusumi et al. | 438/267 |
| 6,891,271 | B2 | 5/2005 | Ebina et al. | |
| 7,476,943 | B2 | 1/2009 | Takahashi et al. | |
| 7,598,589 | B2 | 10/2009 | Takahashi et al. | |
| 2003/0222294 | A1 * | 12/2003 | Yoshino | 257/298 |
| 2009/0321814 | A1 * | 12/2009 | Kawashima et al. | 257/324 |

FOREIGN PATENT DOCUMENTS

| | | |
|---|---|---|
| JP | 2001-77220 | 3/2001 |
| JP | 2006-120949 | 5/2006 |
| JP | 2006-324638 | 11/2006 |

* cited by examiner

*Primary Examiner* — Michael Trinh
(74) *Attorney, Agent, or Firm* — McDermott Will & Emery LLP (57) ABSTRACT

Bit line diffusion layers are formed in an upper part of a semiconductor substrate with a bit line contact region being interposed between the bit line diffusion layers. A conductive film is formed over the semiconductor substrate, the bit line diffusion layers, and first gate insulating films. Then, control gate electrodes are formed from the conductive film. Thereafter, at least the first gate insulating film in the bit line contact region is removed, and a connection diffusion layer is formed in the bit line contact region so as to connect the bit line diffusion layers located on both sides of the bit line contact region. When forming the control gate electrodes, the conductive film is left so as to extend over the bit line contact region and over the bit line diffusion layers located on both sides of the bit line contact region.

7 Claims, 12 Drawing Sheets

METHOD FOR MANUFACTURING A NONVOLATILE SEMICONDUCTOR MEMORY DEVICE

CROSS-REFERENCE TO RELATED APPLICATION

This application claims priority to Japanese Patent Application No. 2009-116826 filed on May 13, 2009, the disclosure of which including the specification, the drawings, and the claims is hereby incorporated by reference in its entirety.

BACKGROUND

The present disclosure relates to methods for manufacturing a nonvolatile semiconductor memory device, and more particularly to methods for manufacturing a nonvolatile semiconductor memory device having both a storage (memory) section and a logic section including, e.g., a complementary metal oxide semiconductor (CMOS) device.

With miniaturization of elements, nonvolatile semiconductor memory devices, having both a memory section and a logic section (a CMOS section) on a semiconductor substrate, and using an oxide-nitride-oxide (ONO) film (a stacked film of a first silicon oxide film, a silicon nitride film, and a second silicon oxide film) as respective gate insulating films of memory transistors of the memory section, are becoming increasingly important.

A conventional nonvolatile semiconductor memory device having both a memory section and a CMOS section will be described below with reference to the accompanying drawings (see, e.g., Japanese Published Patent Application No. 2001-077220).

Figure 11A:
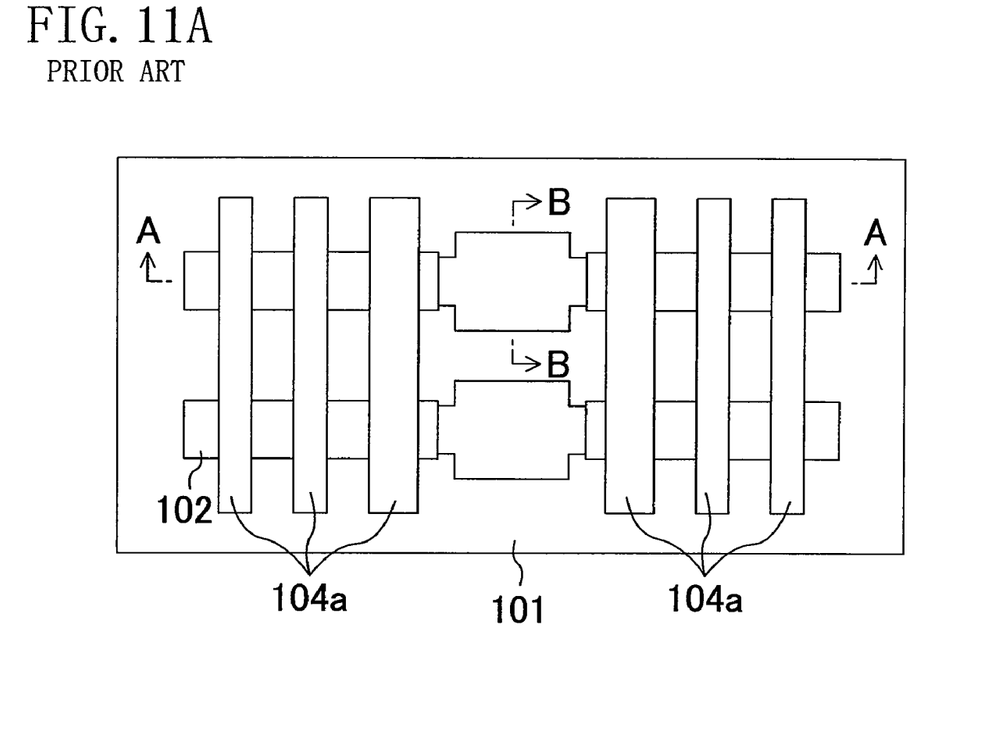
FIGS. 11A and 11B are partial plan views of a conventional nonvolatile semiconductor memory device.
Figure 11B:
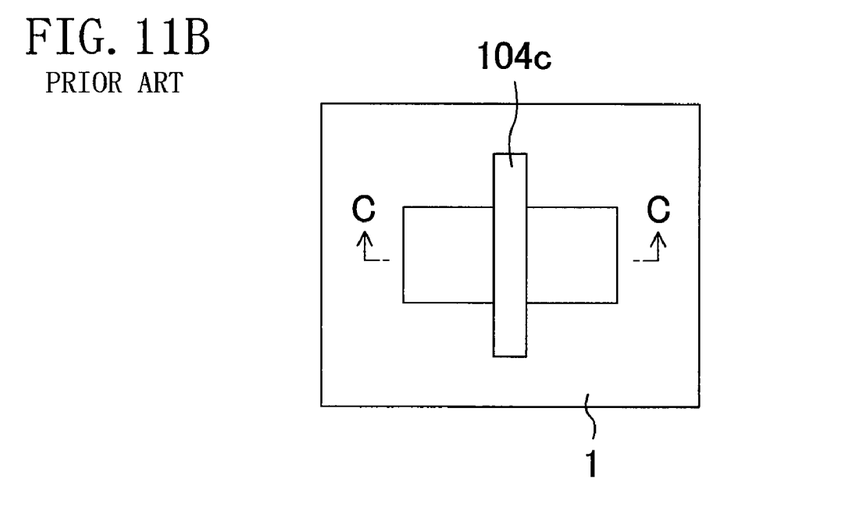
Figure 12A:
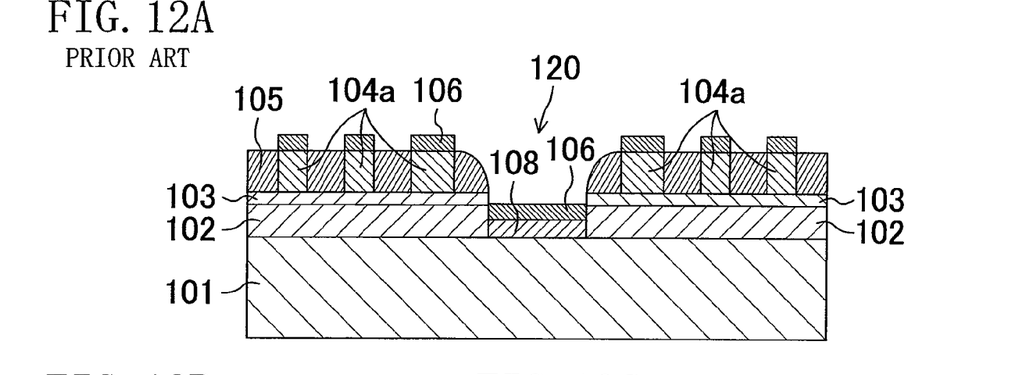
FIG. 12A is a cross-sectional view taken along line A-A in FIG. 11A.
Figures 12B, 12C:
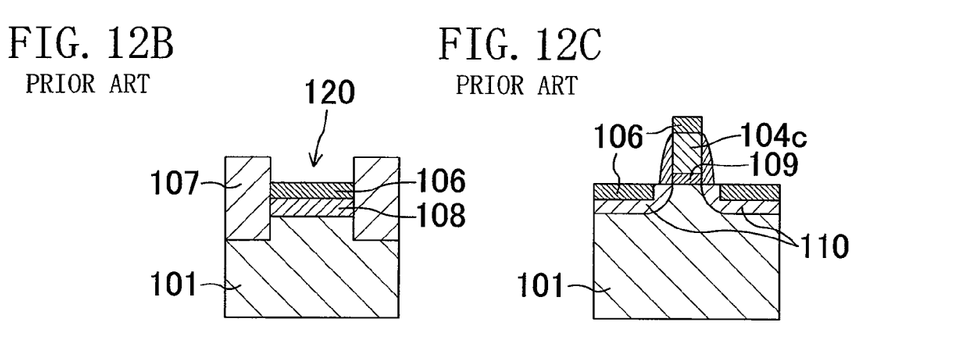
FIG. 12B is a cross-sectional view taken along line B-B in FIG. 11A.
FIG. 12C is a cross-sectional view taken along line C-C in FIG. 11B.

FIGS. 11A-11B and 12A-12C show a conventional nonvolatile semiconductor memory device. FIG. 11A shows a planar configuration of a memory section, and FIG. 11B shows a planar configuration of a CMOS section. Silicide layers 106 are not shown in FIGS. 11A and 11B. FIG. 12A shows a cross-sectional configuration taken along line A-A in FIG. 11A, FIG. 12B shows a cross-sectional configuration taken along line B-B in FIG. 11A, and FIG. 12C shows a cross-sectional configuration taken along line C-C in FIG. 11B.

As shown in FIGS. 11A, 12A, and 12B, in the memory section, bit line diffusion layers 102 are formed in the upper part of a silicon semiconductor substrate 101, and bit line insulating films 103 are respectively formed on the bit line diffusion layers 102. A plurality of control gate electrodes 104a as word lines are formed on the bit line insulating films 103 so that each control gate electrode 104a crosses corresponding ones of the bit line diffusion layers 102. A gap fill insulating film 105 is formed between adjoining ones of the control gate electrodes 104a, and silicide layers 106 are respectively formed on the control gate electrodes 104a.

As shown in FIG. 12B, a bit line contact region 120 between the bit line diffusion layers 102 of the same row is isolated by shallow trench isolation (STI) insulating films 107 in the column direction. The bit line contact region 120 is a region where a contact 115 is to be formed. The bit line contact region 120 is formed by a connection diffusion layer 108 formed in the upper part of the semiconductor substrate 101, and a silicide layer 106 formed on the connection diffusion layer 108. As shown in FIG. 12A, the connection diffusion layer 108 is formed so as to electrically connect the bit line diffusion layers 102 located on both sides of the connection diffusion layer 108.

As shown in FIGS. 11B and 12C, in the CMOS section, a gate insulating film 109 is formed on the silicon semiconductor substrate 101, and a gate electrode 104c is formed on the gate insulating film 109. Source/drain diffusion layers 110 are respectively formed in regions located on both sides of the gate insulating film 109 and the gate electrode 104c in the upper part of the semiconductor substrate 101. Silicide layers 106 are respectively formed on the gate electrode 104c and the source/drain diffusion layers 110.

A method for manufacturing the conventional nonvolatile semiconductor memory device will be described below with reference to the drawings.

FIGS. 13A-19C are a series of cross-sectional views illustrating the method for manufacturing the conventional nonvolatile semiconductor memory device. FIGS. 13A, 14A, 15A, 16A, 17A, 18A, and 19A show cross-sectional configurations taken along line A-A in FIG. 11A. FIGS. 13B, 14B, 15B, 16B, 17B, 18B, and 19B show cross-sectional configurations taken along line B-B in FIG. 11A. FIGS. 13C, 14C, 15C, 16C, 17C, 18C, and 19C show cross-sectional configurations taken along line C-C in FIG. 11B. That is, FIGS. 13A-13B, 14A-14B, 15A-15B, 16A-16B, 17A-17B, 18A-18B, and 19A-19B show the memory section, and FIGS. 13C, 14C, 15C, 16C, 17C, 18C, and 19C show the CMOS section.

Figure 13A:
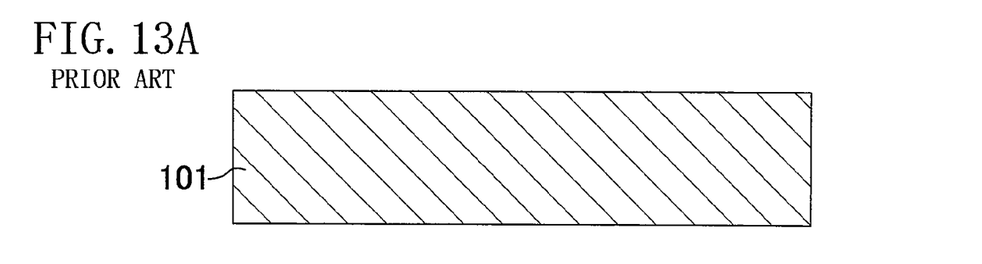
FIGS. 13A, 13B, and 13C are cross-sectional views illustrating a step of a method for manufacturing the conventional nonvolatile semiconductor memory device.
Figure 13B:
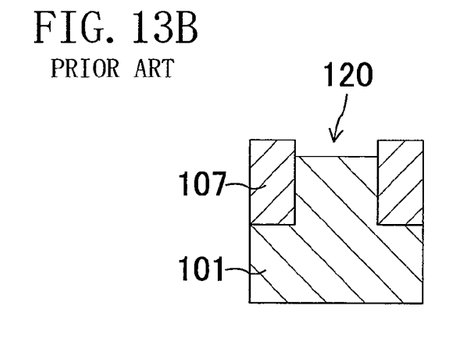
Figure 13C:
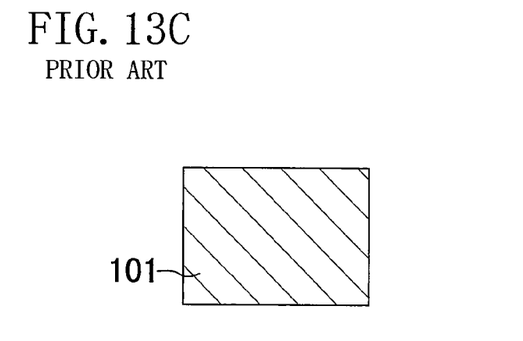

First, as shown in FIGS. 13A-13C, STI insulating films 107 are formed in the upper part of a silicon semiconductor substrate 101 so as to isolate adjoining ones of bit line contact regions 120 from each other.

Figure 14A:
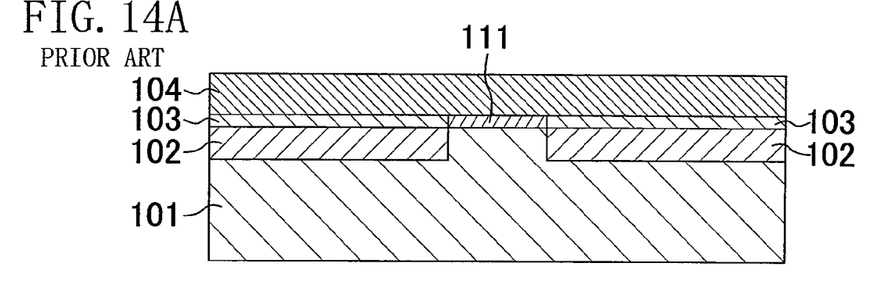
FIGS. 14A, 14B, and 14C are cross-sectional views illustrating a step of the method for manufacturing the conventional nonvolatile semiconductor memory device.
Figure 14B:
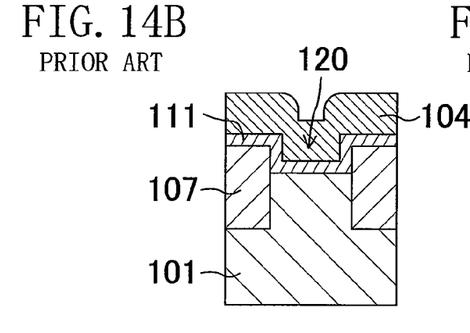
Figure 14C:
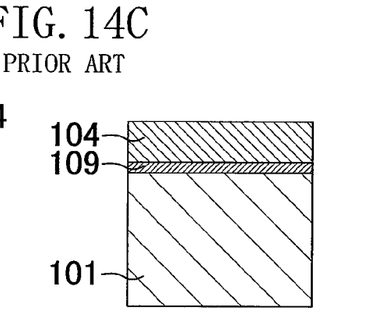

Next, as shown in FIGS. 14A-14C, an ONO film 111 is formed over the entire surface of the semiconductor substrate 101 in the memory section and the CMOS section. The ONO film 111 is a stacked film of a first silicon oxide film, a silicon nitride film, and a second silicon oxide film. Then, in the memory section, regions of the ONO film 111 for forming bit line diffusion layers 102 are removed, and the bit line diffusion layers 102 are formed in the upper part of the exposed semiconductor substrate 101. Thereafter, bit line insulating films 103 are respectively formed on the bit line diffusion layers 102. Then, the ONO film 111 in the CMOS section is removed, and a gate insulating film 109 is formed on the semiconductor substrate 101. Subsequently, a polysilicon film 104 is deposited over the entire surface of the memory section and the CMOS section by a chemical vapor deposition (CVD) method.

Figure 15A:
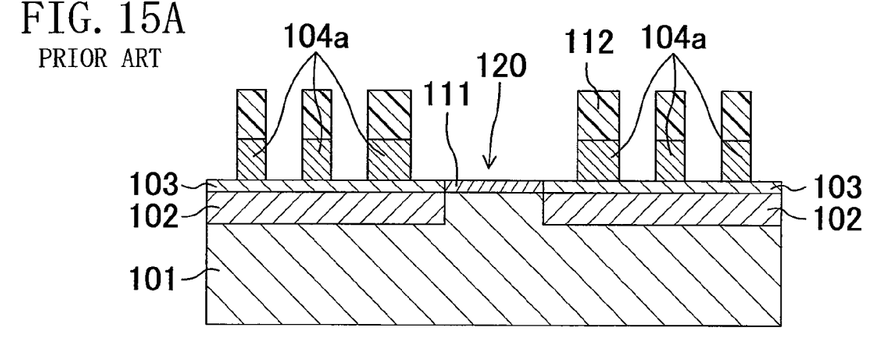
FIGS. 15A, 15B, and 15C are cross-sectional views illustrating a step of the method for manufacturing the conventional nonvolatile semiconductor memory device.
Figure 15B:
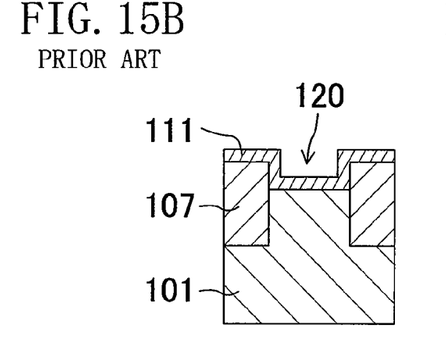
Figure 15C:
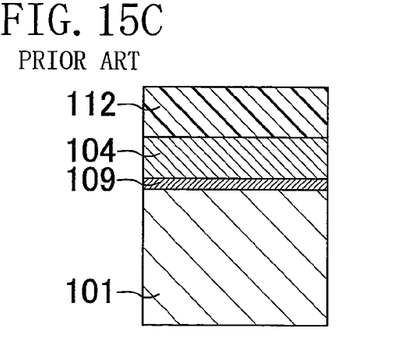

As shown in FIGS. 15A-15C, a mask pattern 112 for forming control gate electrodes is formed in the memory section by a photolithography method. The polysilicon film 104 is etched by using the mask pattern 112, thereby forming control gate electrodes 104a from the polysilicon film 104.

Figure 16A:
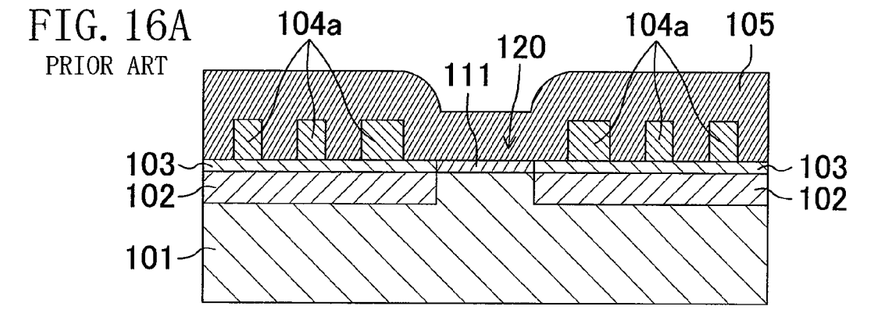
FIGS. 16A, 16B, and 16C are cross-sectional views illustrating a step of the method for manufacturing the conventional nonvolatile semiconductor memory device.
Figure 16B:
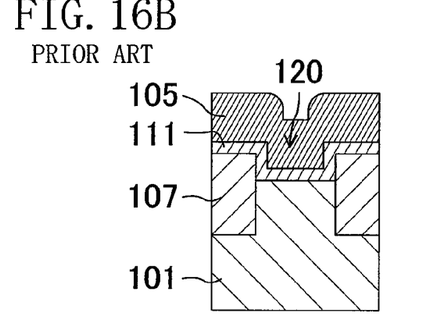
Figure 16C:
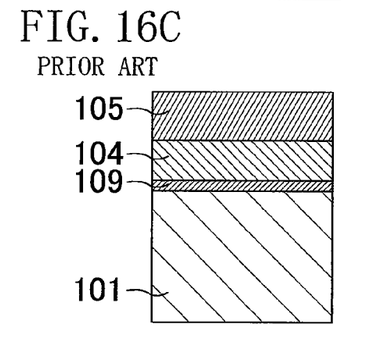

As shown in FIGS. 16A-16C, after the mask pattern 112 is removed, a gap fill insulating film 105 is deposited on the entire surface of the memory section and the CMOS section by a CVD method.

Figure 17A:
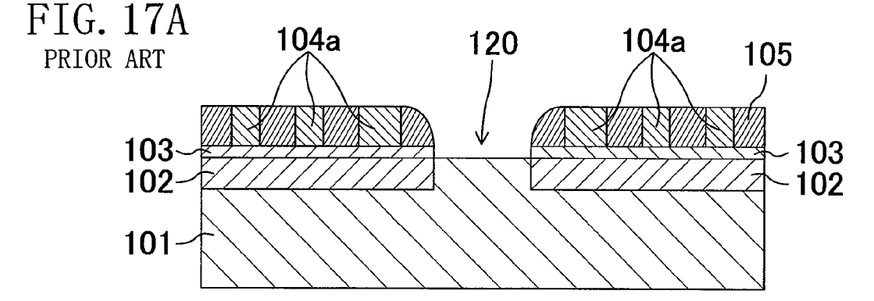
FIGS. 17A, 17B, and 17C are cross-sectional views illustrating a step of the method for manufacturing the conventional nonvolatile semiconductor memory device.
Figure 17B:
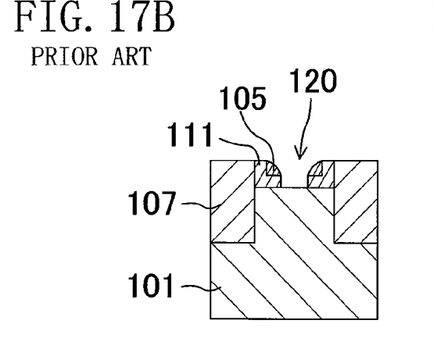
Figure 17C:
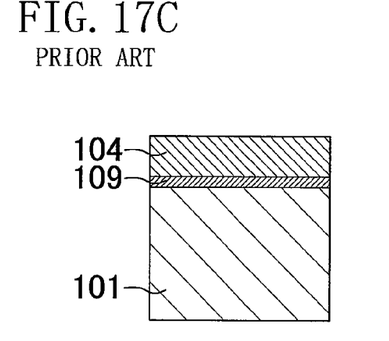

As shown in FIGS. 17A-17C, the deposited gap fill insulating film 105 is etched back by a dry etching method until the control gate electrodes 104a are exposed.

Figure 18A:
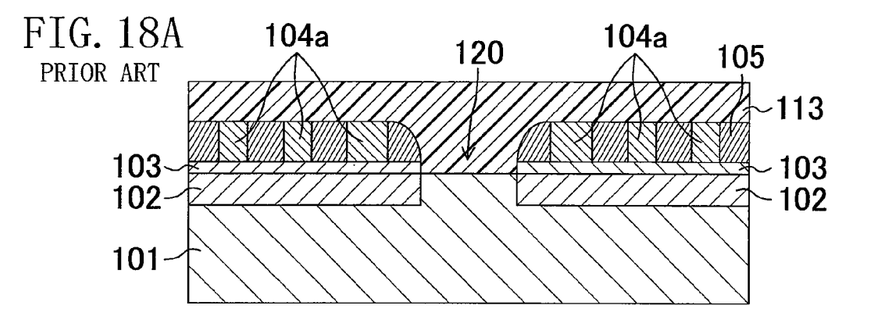
FIGS. 18A, 18B, and 18C are cross-sectional views illustrating a step of the method for manufacturing the conventional nonvolatile semiconductor memory device.
Figure 18B:
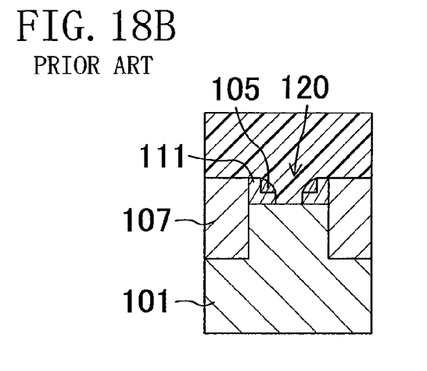
Figure 18C:
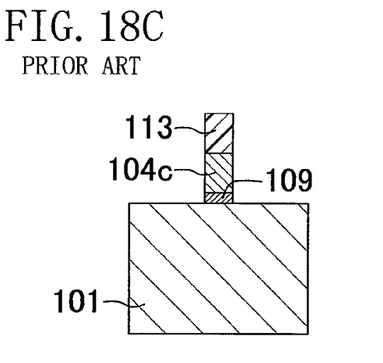

As shown in FIGS. 18A-18C, a mask pattern 113 for forming gate electrodes is formed in the CMOS section by a photolithography method. The polysilicon film 104 is etched by using the mask pattern 113, thereby forming a gate electrode 104c from the polysilicon film 104.

Figure 19A:
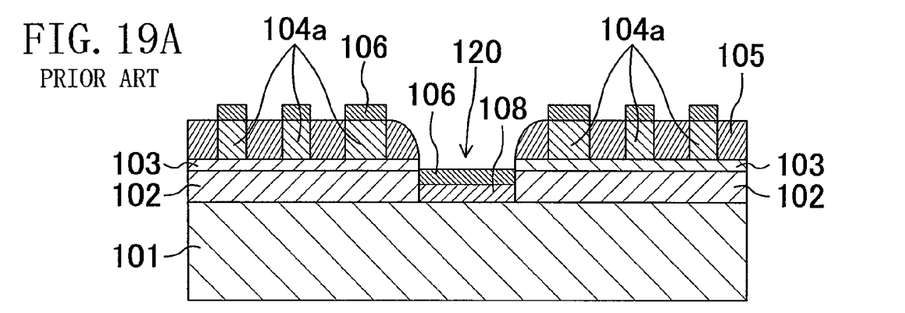
FIGS. 19A, 19B, and 19C are cross-sectional views illustrating a step of the method for manufacturing the conventional nonvolatile semiconductor memory device.
Figure 19B:
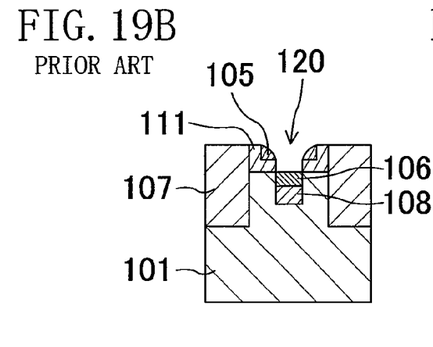
Figure 19C:
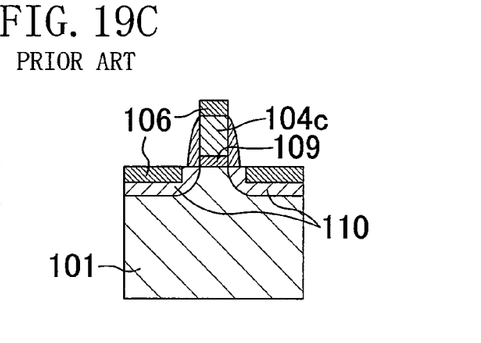

As shown in FIGS. 19A-19C, after the mask pattern 113 is removed, a connection diffusion layer 108 is formed between adjoining ones of the bit line diffusion layers 102 in the semiconductor substrate 101 in the memory section. Source/drain diffusion layers 110 are formed on both sides of the gate insulating film 109 and the gate electrode 104c in the semiconductor substrate 101 in the CMOS section. Then, silicide layers 106 are respectively formed on the control gate electrodes 104a, the connection diffusion layer 108, the gate electrode 104c, and the source/drain diffusion layers 110.

SUMMARY

Figure 20A:
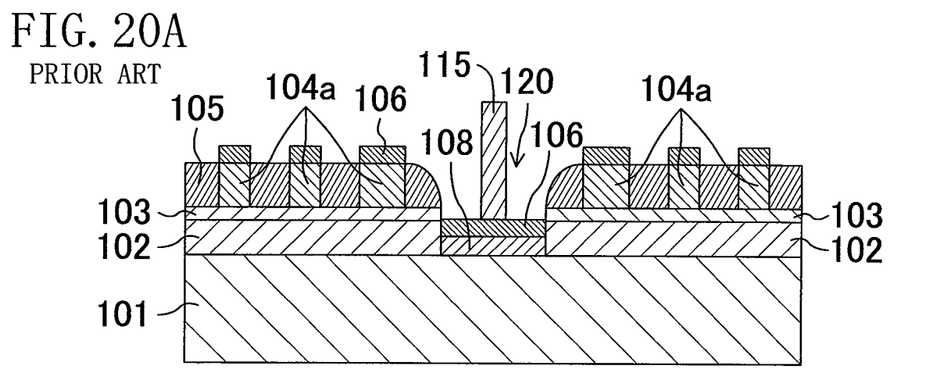
FIGS. 20A, 20B, and 20C are cross-sectional views schematically showing how the area of a silicide layer decreases, and a margin for alignment of a contact with respect to the silicide layer decreases accordingly in the method for manufacturing the conventional nonvolatile semiconductor memory device.
Figure 20B:
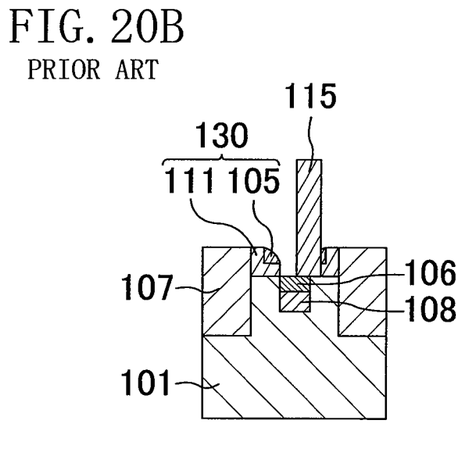
Figure 20C:
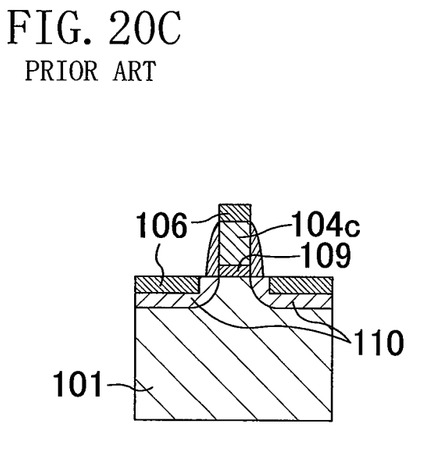

The method for manufacturing the conventional nonvolatile semiconductor memory device has the following problem due to parasitic sidewalls 130 formed on the side surfaces of the STI insulating films 107, as shown in FIG. 20B.

That is, the area of the silicide layer 106 decreases, which reduces a margin for alignment of the contact 115, which is to be formed on the silicide layer 106, with respect to the silicide layer 106. Thus, contact resistance increases if the contact 115 is displaced from the silicide layer 106.

In view of the above problem, it is an object of the present invention to suppress or prevent an increase in contact resistance due to a decrease in margin for alignment of a contact.

In order to achieve the above object, in a method for manufacturing a nonvolatile semiconductor memory device according to the present invention, a conductive film for forming word lines is formed so as to cover a region where a connection diffusion layer is to be formed (a bit line contact region).

Specifically, according to the present invention, a method for manufacturing a nonvolatile semiconductor memory device having a storage section provided with a plurality of memory cells, and a logic section having a plurality of transistors formed therein, on a semiconductor substrate includes the steps of: (a) forming a bit line contact region, which is a region where a contact is to be formed, on the semiconductor substrate in the storage section, forming a plurality of first gate insulating films on the semiconductor substrate, including on the bit line contact region, in the storage section so as to extend in a row direction, and forming a second gate insulating film on the semiconductor substrate in the logic section; (b) forming a plurality of bit line diffusion layers in an upper part of the semiconductor substrate in the storage section so as to extend in the row direction with the bit line contact region interposed therebetween; (c) forming a conductive film over the semiconductor substrate, the bit line diffusion layers, and the first gate insulating films in the storage section, and forming the conductive film on the second gate insulating film in the logic section; (d) forming a plurality of word lines from the conductive film in the storage section so that each word line crosses corresponding ones of the plurality of bit line diffusion layers, and extends in a column direction; (e) filling a gap between adjoining ones of the word lines in the storage section with an interlayer insulating film; (f) forming a gate electrode from the conductive film on the second gate insulating film in the logic section; and (g) removing at least the first gate insulating film in the bit line contact region in the storage section, and forming a connection diffusion layer in the bit line contact region in the upper part of the semiconductor substrate so as to connect the bit line diffusion layers located on both sides of the bit line contact region, wherein in the step (d), the conductive film is left so as to extend over the bit line contact region and over the bit line diffusion layers located on both sides of the bit line contact region, and the step (f) includes the step (f1) of forming end word lines from the remaining conductive film in the storage section so as to adjoin each other with the connection diffusion layer interposed therebetween.

According to the method of the present invention, the conductive film is formed in advance in the bit line contact region. Thus, no interlayer insulating film remains in the bit line contact region, and no parasitic sidewall is formed. This can suppress or prevent a decrease in margin for alignment between the silicide layer and the contact, and thus can suppress or prevent an increase in contact resistance.

In the method of the present invention, it is preferable that the step (b) include the step (b1) of forming a bit line insulating film on the bit line diffusion layers.

In the method of the present invention, it is preferable that the step (g) include the step (g1) of forming source/drain diffusion layers on both sides of the second gate insulating film and the gate electrode in the upper part of the semiconductor substrate in the logic section.

In the method of the present invention, the semiconductor substrate may be made of silicon, and the method may further include the step of: (h) after the step (g), forming a metal silicide layer on the word lines and the connection diffusion layer in the storage section, and on the gate electrode and the source/drain diffusion layers in the logic section.

In the method of the present invention, it is preferable that a width of the end word lines be larger than that of the word lines.

In the method of the present invention, the end word lines may be dummy word lines that do not contribute to a storage operation.

In the method of the present invention, it is preferable that, in the step (a), the first gate insulating films be made of an ONO film, which is a stacked film of a first silicon oxide film, a silicon nitride film, and a second silicon oxide film.

As described above, according to the method for manufacturing a nonvolatile semiconductor device of the present invention, no parasitic sidewall is formed in the bit line contact region, whereby a decrease in margin for alignment between a silicide layer and a contact can be suppressed or prevented. Thus, an increase in contact resistance can be suppressed or prevented. Moreover, increased miniaturization and performance of the nonvolatile semiconductor memory device can be achieved without increasing manufacturing cost.

BRIEF DESCRIPTION OF THE DRAWINGS

FIGS. 2A, 2B, and 2C show the nonvolatile semiconductor memory device of the example embodiment, where

FIGS. 12A, 12B, and 12C show the conventional nonvolatile semiconductor memory device, where

DETAILED DESCRIPTION

A nonvolatile semiconductor memory device according to an example embodiment will be described with reference to the accompanying drawings.

Figure 1A:
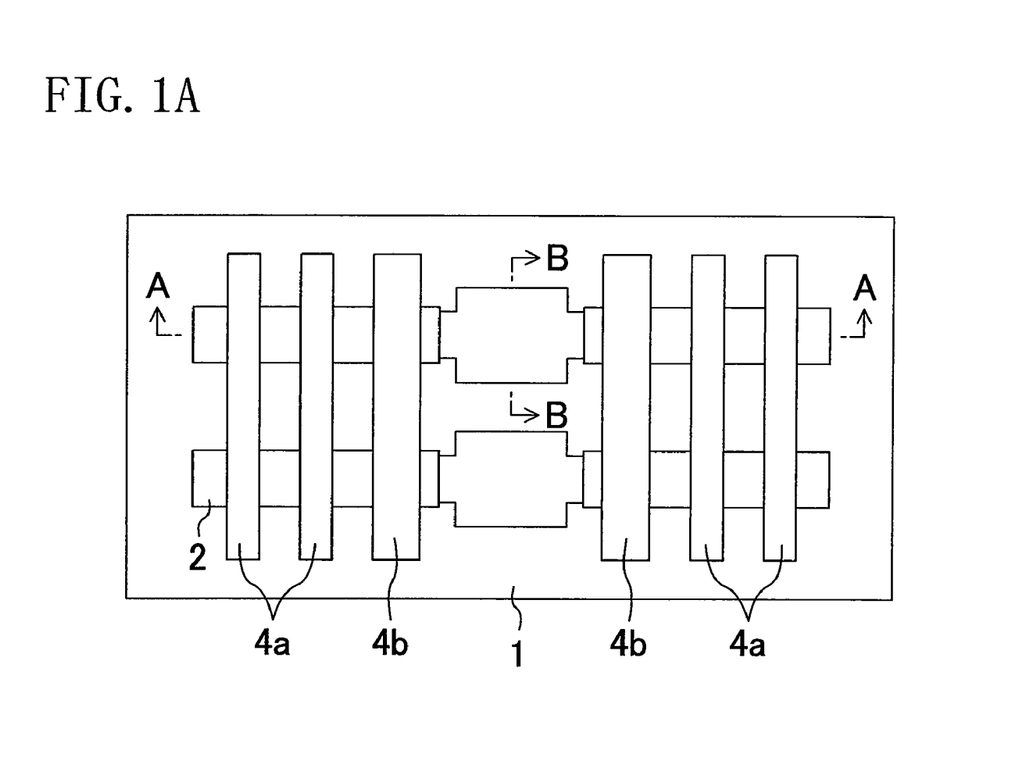
FIGS. 1A and 1B are partial plan views of a nonvolatile semiconductor memory device according to an example embodiment.
Figure 1B:
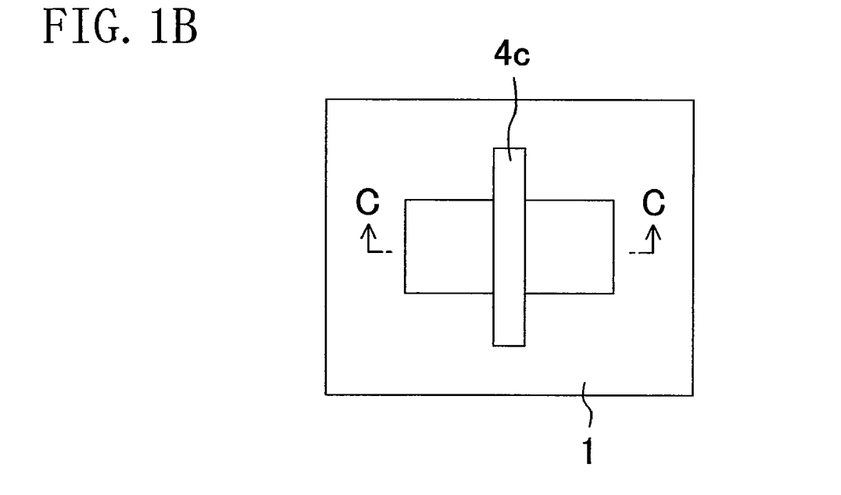
Figure 2A:
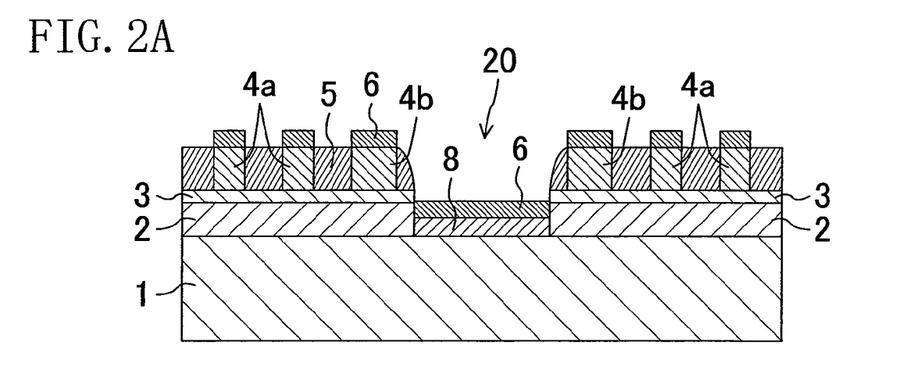
FIG. 2A is a cross-sectional view taken along line A-A in FIG. 1A.
Figure 2B:
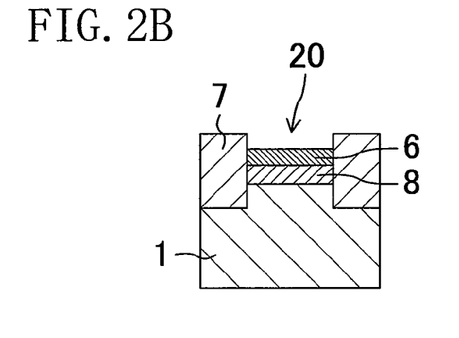
FIG. 2B is a cross-sectional view taken along line B-B in FIG. 1A.
Figure 2C:
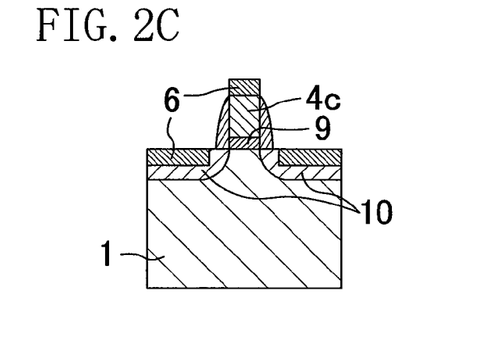
FIG. 2C is a cross-sectional view taken along line C-C in FIG. 1B.

FIGS. 1A-1B and 2A-2C show the nonvolatile semiconductor memory device of the example embodiment. FIG. 1A shows a planar configuration of a memory section, and FIG. 1B shows a planar configuration of a CMOS section. Silicide layers 6 are not shown in FIGS. 1A and 1B. FIG. 2A shows a cross-sectional configuration taken along line A-A in FIG. 1A, FIG. 2B shows a cross-sectional configuration taken along line B-B in FIG. 1A, and FIG. 2C shows a cross-sectional configuration taken along line C-C in FIG. 1B.

As shown in FIGS. 1A, 2A, and 2B, in the memory section, bit line diffusion layers 2 are formed in the upper part of a silicon semiconductor substrate 1, and bit line insulating films 3 are respectively formed on the bit line diffusion layers 2. A plurality of control gate electrodes 4a and control gate electrodes 4b as word lines and end word lines, respectively, are formed on the bit line insulating films 103 so that each control gate electrode 4a, 4b crosses corresponding ones of the bit line diffusion layers 2. A gap fill insulating film 5 is formed between adjoining ones of the control gate electrodes 4a, and between each control gate electrode 4b and the control gate electrode 4a that adjoins the control electrode 4b. Silicide layers 106 are respectively formed on the control gate electrodes 4a, 4b.

As shown in FIG. 2B, a bit line contact region 20 between the bit line diffusion layers 2 of the same row is isolated by shallow trench isolation (STI) insulating films 7 in the column direction. The bit line contact region 20 is a region where a contact 15 is to be formed. The bit line contact region 20 is formed by a connection diffusion layer 8 formed in the upper part of the semiconductor substrate 1, and a silicide layer 6 formed on the connection diffusion layer 8. As shown in FIG. 2A, the connection diffusion layer 8 is formed so as to electrically connect the bit line diffusion layers 2 located on both sides of the connection diffusion layer 8.

As shown in FIGS. 1B and 2C, in the CMOS section, a gate insulating film 9 is formed on the silicon semiconductor substrate 1, and a gate electrode 4c is formed on the gate insulating film 9. Source/drain diffusion layers 10 are respectively formed in regions located on both sides of the gate insulating film 9 and the gate electrode 4c in the upper part of the semiconductor substrate 1. Silicide layers 6 are respectively formed on the gate electrode 4c and the source/drain diffusion layers 10.

A method for manufacturing the nonvolatile semiconductor memory device according to the example embodiment will be described below with reference to the drawings.

FIGS. 3A-9C are a series of cross-sectional views illustrating the method for manufacturing the nonvolatile semiconductor memory device according to the example embodiment. FIGS. 3A, 4A, 5A, 6A, 7A, 8A, and 9A show cross-sectional configurations taken along line A-A in FIG. 1A. FIGS. 3B, 4B, 5B, 6B, 7B, 8B, and 9B show cross-sectional configurations taken along line B-B in FIG. 1A. FIGS. 3C, 4C, 5C, 6C, 7C, 8C, and 9C show cross-sectional configurations taken along line C-C in FIG. 1B. That is, FIGS. 3A-3B, 4A-4B, 5A-5B, 6A-6B, 7A-7B, 8A-8B, and 9A-9B show the memory section, and FIGS. 3C, 4C, 5C, 6C, 7C, 8C, and 9C show the CMOS section.

Figure 3A:
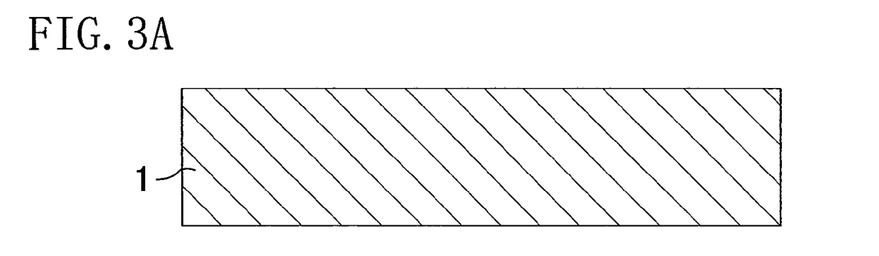
FIGS. 3A, 3B, and 3C are cross-sectional views illustrating a step of a method for manufacturing a nonvolatile semiconductor memory device according to the example embodiment.
Figure 3B:
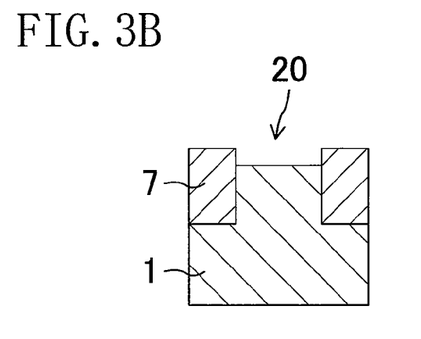
Figure 3C:
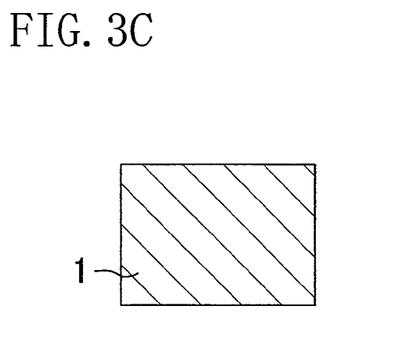

First, as shown in FIGS. 3A-3C, STI insulating films 7 are formed in the upper part of a silicon semiconductor substrate 1 so as to isolate adjoining ones of bit line contact regions 20 from each other.

Figure 4A:
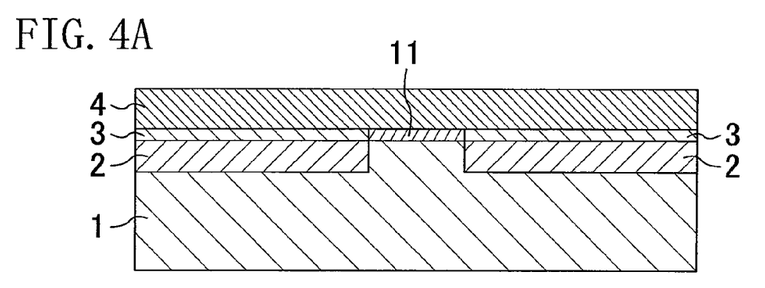
FIGS. 4A, 4B, and 4C are cross-sectional views illustrating a step of the method for manufacturing a nonvolatile semiconductor memory device according to the example embodiment.
Figure 4B:
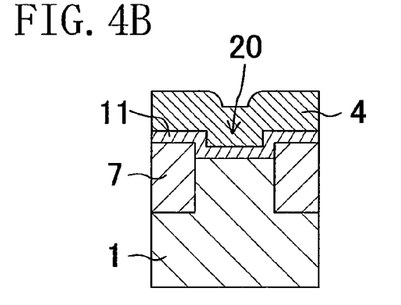
Figure 4C:
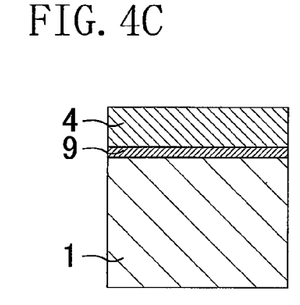

Next, as shown in FIGS. 4A-4C, an ONO film 11 is formed over the entire surface of the semiconductor substrate 1 in the memory section and the CMOS section. The ONO film 11 is a stacked film of a first silicon oxide film, a silicon nitride film, and a second silicon oxide film. The ONO film 11 is formed by, e.g., forming a first silicon oxide film having a thickness of about 5 nm on the semiconductor substrate 1 by a thermal oxidation method, forming a silicon nitride film having a thickness of about 15 nm on the first silicon oxide film by a chemical vapor deposition (CVD) method, and then forming a second silicon oxide film having a thickness of about 20 nm on the silicon nitride film by a thermal oxidation method. Note that the second silicon oxide film may have a stacked structure of a silicon oxide film formed by a thermal oxidation method, and a silicon oxide film formed by a CVD method.

Then, in the memory section, regions of the ONO film 11 for forming bit line diffusion layers 2 are removed by a dry etching method. Arsenic (As) ions are implanted into the exposed semiconductor substrate 1 at an accelerating voltage of 30 keV and a dose of $2.0 \times 10^{15}$ ions/cm$^2$ to form the bit line diffusion layers 2. Subsequently, the respective upper surfaces of the bit line diffusion layers 2 are oxidized by a thermal oxidation method to form bit line insulating films 3 having a thickness of about 50 nm.

Then, in the CMOS section, the ONO film 11 is removed by a wet etching method, and a gate insulating film 9 having a thickness of about 3 nm to about 20 nm is formed on the exposed semiconductor substrate 1 by a thermal oxidation method. Thereafter, a doped polysilicon film 4 having a thickness of about 200 nm is deposited over the entire surface of the memory section and the CMOS section by a CVD method. Note that a process of doping the polysilicon film 4 may be performed by an ion implantation method after the polysilicon film 4 is deposited.

Figure 5A:
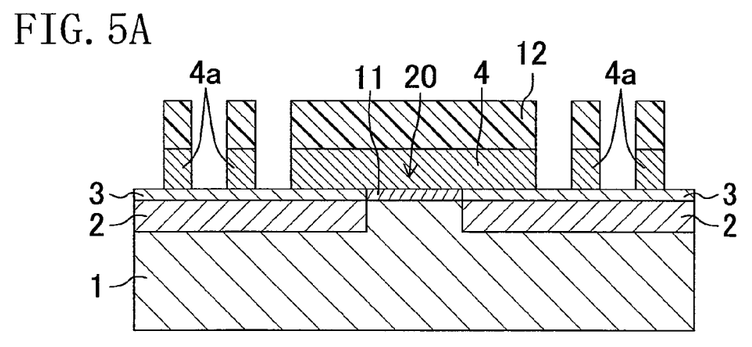
FIGS. 5A, 5B, and 5C are cross-sectional views illustrating a step of the method for manufacturing a nonvolatile semiconductor memory device according to the example embodiment.
Figure 5B:
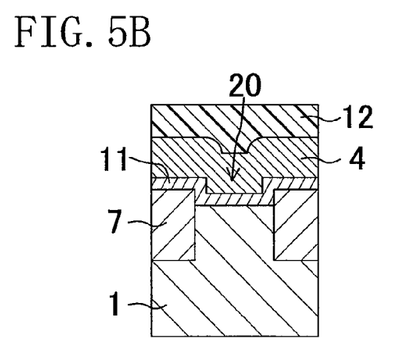
Figure 5C:
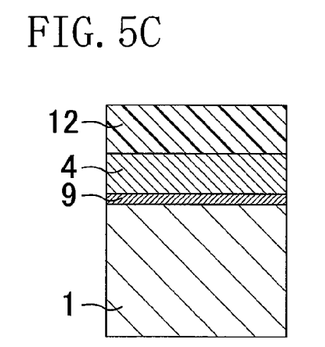

As shown in FIGS. 5A-5C, a mask pattern 12 for forming control gate electrodes is formed on the polysilicon film 4 by a photolithography method. The polysilicon film 4 is dry etched by using the mask pattern 12, thereby forming control gate electrodes 4a from the polysilicon film 4. At this time, since the bit line contact region 20 shown in FIGS. 5A and 5B is covered by the mask pattern 12, the polysilicon film 4 remains in the bit line contact region 20.

Figure 6A:
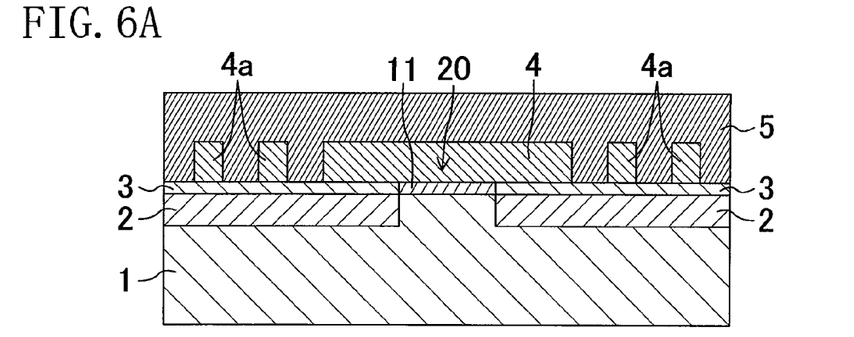
FIGS. 6A, 6B, and 6C are cross-sectional views illustrating a step of the method for manufacturing a nonvolatile semiconductor memory device according to the example embodiment.
Figure 6B:
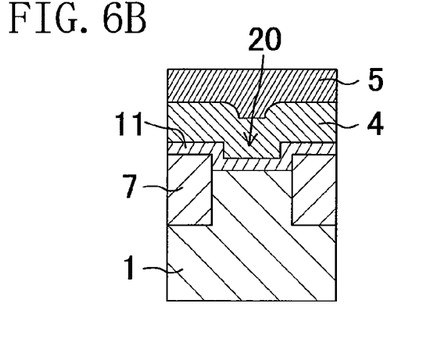
Figure 6C:
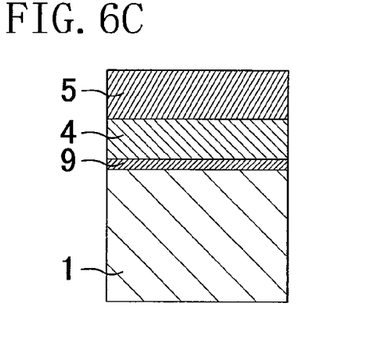

As shown in FIGS. 6A-6C, after the mask pattern 12 is removed, a gap fill insulating film 5 is deposited on the entire surface of the memory section and the CMOS section by a CVD method. The gap fill insulating film 5 is a third silicon oxide film having a thickness of about 450 nm.

Figure 7A:
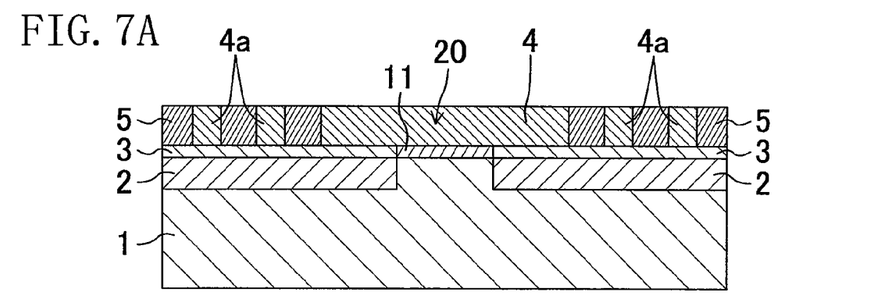
FIGS. 7A, 7B, and 7C are cross-sectional views illustrating a step of the method for manufacturing a nonvolatile semiconductor memory device according to the example embodiment.
Figure 7B:
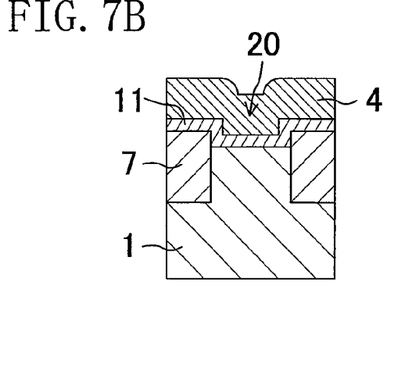
Figure 7C:
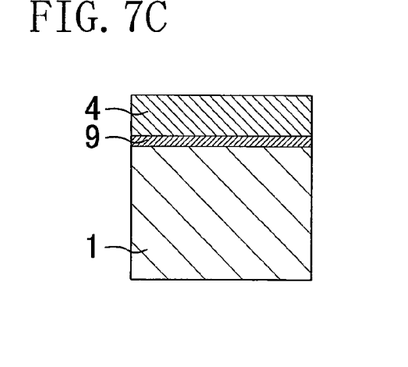

As shown in FIGS. 7A-7C, the deposited gap fill insulating film 5 is etched back by a dry etching method until the control gate electrodes 4a and the polysilicon film 4 are exposed.

Figure 8A:
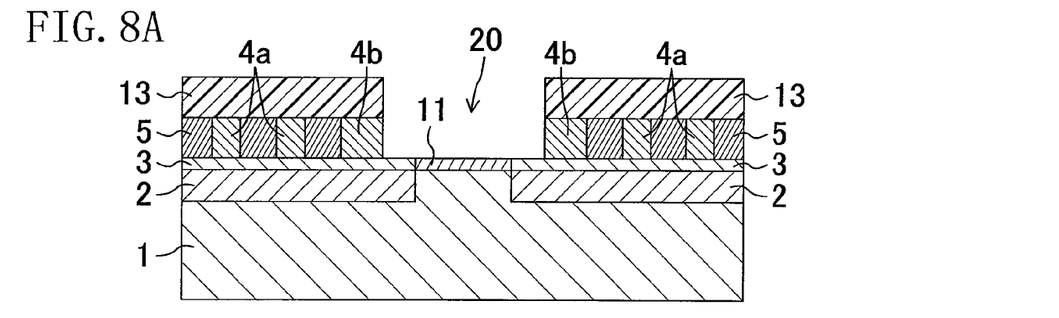
FIGS. 8A, 8B, and 8C are cross-sectional views illustrating a step of the method for manufacturing a nonvolatile semiconductor memory device according to the example embodiment.
Figure 8B:
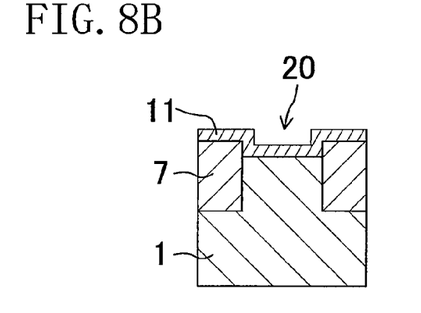
Figure 8C:
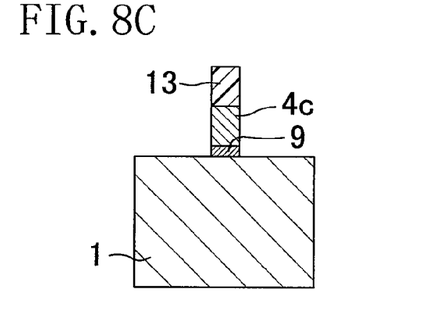

As shown in FIGS. 8A-8C, a mask pattern 13 for forming gate electrodes is formed in the CMOS section by a photolithography method. The polysilicon film 4 is etched by using the mask pattern 13, thereby forming a gate electrode 4c from the polysilicon film 4. At this time, the mask pattern 13 is simultaneously formed in the memory section as well, and an etching process is performed by using the mask pattern 13, thereby removing a part of the polysilicon film 4 included in the bit line contact region 20 in the memory section. Thus, control gate electrodes 4b as end word lines are formed on both sides of the bit line contact region 20. This etching process for removing the polysilicon film 4 is performed with a high selectivity to the second silicon oxide film, which is the uppermost surface of the ONO film 11. This enables the polysilicon film 4 to be etched to a depth equal to or greater than the deposition thickness thereof, whereby the polysilicon film 4 can be completely removed by overetching the polysilicon film 4 that covers the respective stepped portions of the STI insulating films 7. Thus, no parasitic sidewall is formed on the stepped portions of the STI insulating films 7 as in the related art shown in FIG. 17B.

Provided that D represents the width of one of the control gate electrodes 4b formed on both sides of the bit line contact region 20, and E represents the width of the other control gate electrode 4b, D and E can have any of the relations D=E, D>E, and D<E, depending on the combination of the respective dimensions of the mask pattern 12 for forming the gate control gate electrodes, and the mask pattern 13 for forming the gate electrodes, and misalignments of the mask patterns 12 and 13. Thus, the control gate electrodes 4b may be formed as dummy gate electrodes that do not contribute to an operation.

Figure 9A:
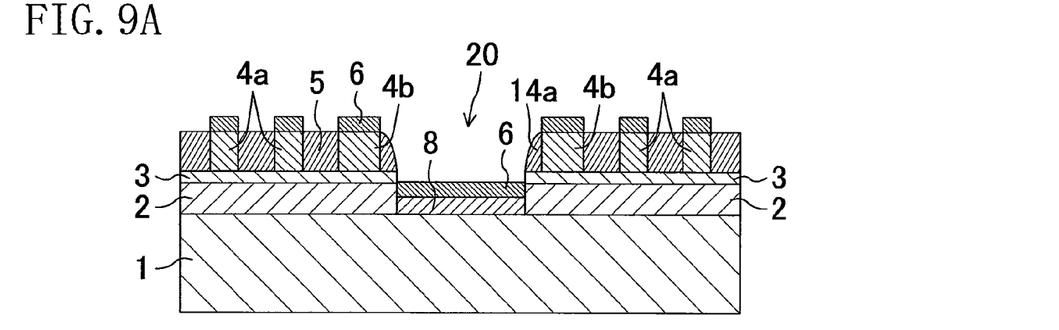
FIGS. 9A, 9B, and 9C are cross-sectional views illustrating a step of the method for manufacturing a nonvolatile semiconductor memory device according to the example embodiment.
Figure 9B:
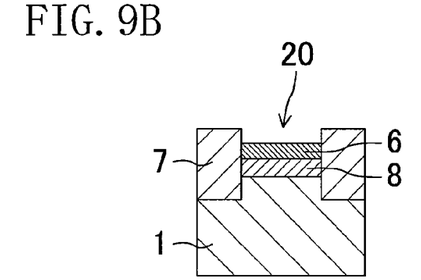
Figure 9C:
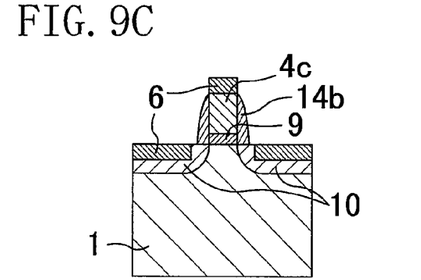

As shown in FIGS. 9A-9C, after the mask pattern 13 is removed, a fourth silicon oxide film (not shown) having a thickness of about 100 nm is deposited over the entire surface of the memory section and the CMOS section by a CVD method. Then, the fourth silicon oxide film is etched back by a dry etching method to form sidewall films 14a, 14b on the respective side surfaces of the control gate electrodes 4b facing the bit line contact region 20, and on both side surfaces of the gate electrode 4c in the CMOS section, respectively. The ONO film 11 exposed in the bit line contact region 20 is also removed in this etching process. Then, arsenic (As) ions are implanted into the bit line contact region 20 in the semiconductor substrate 1 in the memory section, and into the regions located on both sides of the gate insulating film 9 and the gate electrode 4c in the semiconductor substrate 1 in the CMOS section, at an accelerating voltage of 50 keV and a dose of $3.0 \times 10^{15}$ ions/cm$^2$. Thus, a connection diffusion layer 8, which electrically connects adjoining ones of the bit line diffusion layers 2, is formed in the semiconductor substrate 1 in the memory section, and source/drain diffusion layers 10 are formed on both sides of the gate insulating film 9 and the gate electrode 4c in the semiconductor substrate 1 in the CMOS section. Then, silicide layers 6 are respectively formed on the control gate electrodes 4a, 4b, the connection diffusion layer 8, the gate electrode 4c, and the source/drain diffusion layers 10.

Although illustration and description are omitted, a process of forming metal interconnects, a process of forming a protective film, a process of forming bonding pads, and the like are then performed to complete the nonvolatile semiconductor memory device.

Figure 10A:
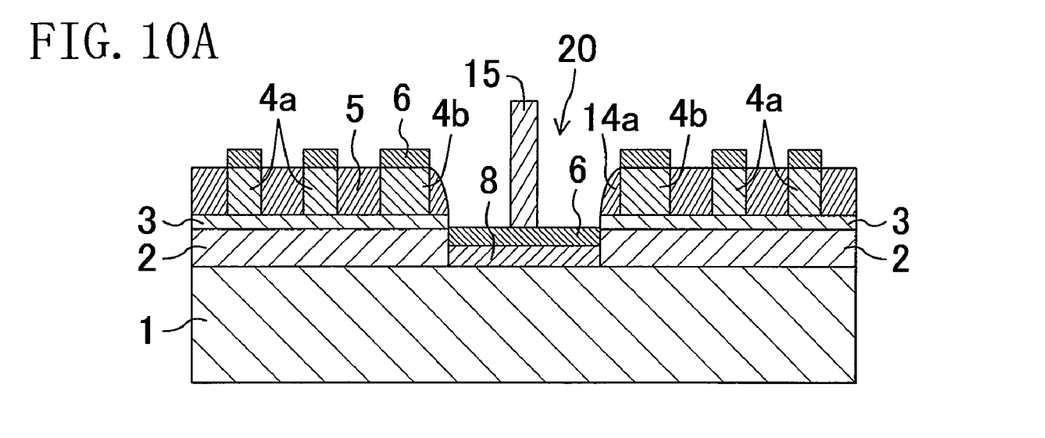
FIGS. 10A, 10B, and 10C are cross-sectional views illustrating a step of the method for manufacturing a nonvolatile semiconductor memory device according to the example embodiment, and schematically show the effects of the present disclosure.
Figure 10B:
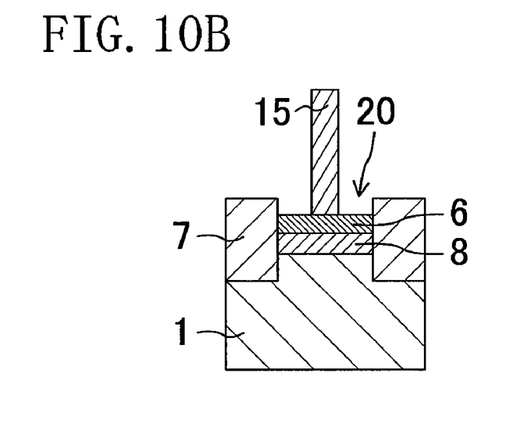
Figure 10C:
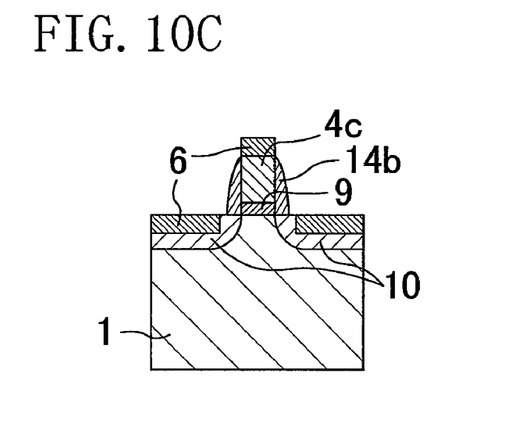

According to the example embodiment, as shown in FIG. 7B, the polysilicon film 4 remains in the bit line contact region 20. Thus, the gap fill insulating film 5 over the bit line contact region 20 is completely removed by the etchback process. Moreover, as described above, the etching process for removing the polysilicon film 4 is performed with a high selectivity to the second silicon oxide film of the ONO film 11. This enables the polysilicon film 4 to be etched to a depth equal to or greater than the deposition thickness thereof, whereby the polysilicon film 4 can be completely removed by overetching the polysilicon film 4 that covers the respective stepped portions of the STI insulating films 7. Thus, no parasitic sidewall is formed on the stepped portions of the STI insulating films 7 as in the related art shown in FIG. 17B. As shown in FIG. 10B, this enables the connection diffusion layer 8 and the silicide layer 6 to be formed so as to extend along the entire length between the respective ends of the STI insulating films 7 in the bit line contact region 20. This can suppress or prevent a decrease in margin for alignment between the silicide layer 6 and the contact 15, and thus can suppress or prevent an increase in contact resistance.

As described above, the method for manufacturing a nonvolatile semiconductor memory device according to the present disclosure can suppress or prevent a decrease in margin for alignment between a contact and a silicide layer in a connection diffusion layer in a memory section, and an increase in contact resistance caused by such a decrease in margin. The method of the present disclosure is useful especially as methods for manufacturing a nonvolatile semiconductor memory device having both a memory section and a CMOS section.

What is claimed is:

1. A method for manufacturing a nonvolatile semiconductor memory device having a storage section provided with a plurality of memory cells, and a logic section having a plurality of transistors formed therein, on a semiconductor substrate, comprising the steps of:

(a) forming a bit line contact region, which is a region where a contact is to be formed, on the semiconductor substrate in the storage section, forming a plurality of first gate insulating films on the semiconductor substrate, including on the bit line contact region, in the storage section so as to extend in a row direction, and forming a second gate insulating film on the semiconductor substrate in the logic section;

(b) forming a plurality of bit line diffusion layers in an upper part of the semiconductor substrate in the storage section so as to extend in the row direction with the bit line contact region interposed therebetween;

(c) forming a conductive film over the semiconductor substrate, the bit line diffusion layers, and the first gate insulating films in the storage section, and forming the conductive film on the second gate insulating film in the logic section;

(d) forming a plurality of word lines from the conductive film in the storage section so that each word line crosses corresponding ones of the plurality of bit line diffusion layers, and extends in a column direction;

(e) filling a gap between adjoining ones of the word lines in the storage section with an interlayer insulating film;

(f) forming a gate electrode from the conductive film on the second gate insulating film in the logic section; and (g) removing at least the first gate insulating film in the bit line contact region in the storage section, and forming a connection diffusion layer in the bit line contact region in the upper part of the semiconductor substrate so as to connect the bit line diffusion layers located on both sides of the bit line contact region, wherein in the step (d), the conductive film is left so as to extend over the bit line contact region and over the bit line diffusion layers located on both sides of the bit line contact region, and the step (f) includes the step (f1) of forming end word lines from the remaining conductive film in the storage section so as to adjoin each other with the connection diffusion layer interposed therebetween.

2. The method of claim 1, wherein
the step (b) includes the step (b1) of forming a bit line insulating film on the bit line diffusion layers.

3. The method of claim 1, wherein
the step (g) includes the step (g1) of forming source/drain diffusion layers on both sides of the second gate insulating film and the gate electrode in the upper part of the semiconductor substrate in the logic section.

4. The method of claim 1, wherein
the semiconductor substrate is made of silicon,
the method further comprising the step of:
(h) after the step (g), forming a metal silicide layer on the word lines and the connection diffusion layer in the storage section, and on the gate electrode and the source/drain diffusion layers in the logic section.

5. The method of claim 1, wherein
a width of the end word lines is larger than that of the word lines.

6. The method of claim 1, wherein
the end word lines are dummy word lines that do not contribute to a storage operation.

7. The method of claim 1, wherein
in the step (a), the first gate insulating films are made of an ONO film, which is a stacked film of a first silicon oxide film, a silicon nitride film, and a second silicon oxide film.

* * * * *